United States Patent [19]
Golio et al.

[11] Patent Number: 5,043,993
[45] Date of Patent: Aug. 27, 1991

[54] OPTICAL SIGNAL FREQUENCY CONVERTER AND MIXER

[75] Inventors: John M. Golio, Chandler; Earnest J. Johnson, Mesa, both of Ariz.

[73] Assignee: Motorola, Inc., Schaumburg, Ill.

[21] Appl. No.: 516,651

[22] Filed: Apr. 30, 1990

[51] Int. Cl.$^5$ .............................................. H01S 3/096
[52] U.S. Cl. ........................................ 372/38; 372/26; 372/50
[58] Field of Search ..................... 307/425; 357/19, 40, 357/41; 372/50, 26, 38

[56] References Cited

U.S. PATENT DOCUMENTS
4,884,119 11/1989 Miller ................................... 357/19

OTHER PUBLICATIONS
D. A. B. Miller, "Field-Effect Transistor Self-Electrooptic Effect Device: Integrated Photodiode, Quantum Well Modulator and Transistor", *IEEE Photonics Technology Letters*, vol. 1, No. 3, Mar. 1989, pp. 62-64.

Primary Examiner—James W. Davie
Attorney, Agent, or Firm—Joe E. Barbee; Miriam Jackson

[57] ABSTRACT

Optical signal frequency conversion and mixing is accomplished by an optical device comprised of a photodetector, a non-linear device, passive circuitry, and a multiple quantum well structure. The photodetector converts a light signal into an electrical signal. The non-linear devices create harmonics of the electrical signal of which the passive circuitry selects a desired frequency of the harmonics. This selected frequency in turn modulates the multiple quantum well structure. A power bias is applied to the multiple quantum well structure which is then modulated by it to produce a modulated output light beam modulated at the selected frequency.

11 Claims, 2 Drawing Sheets

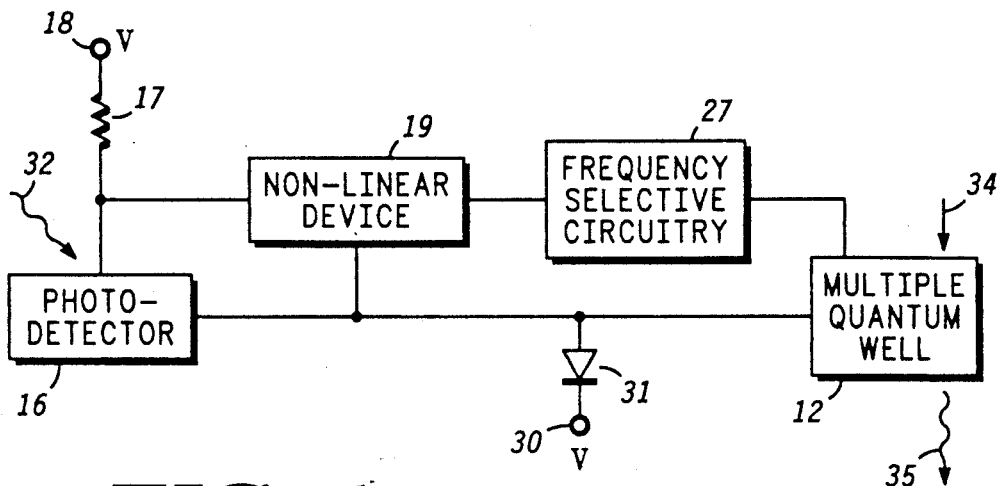
FIG. 1
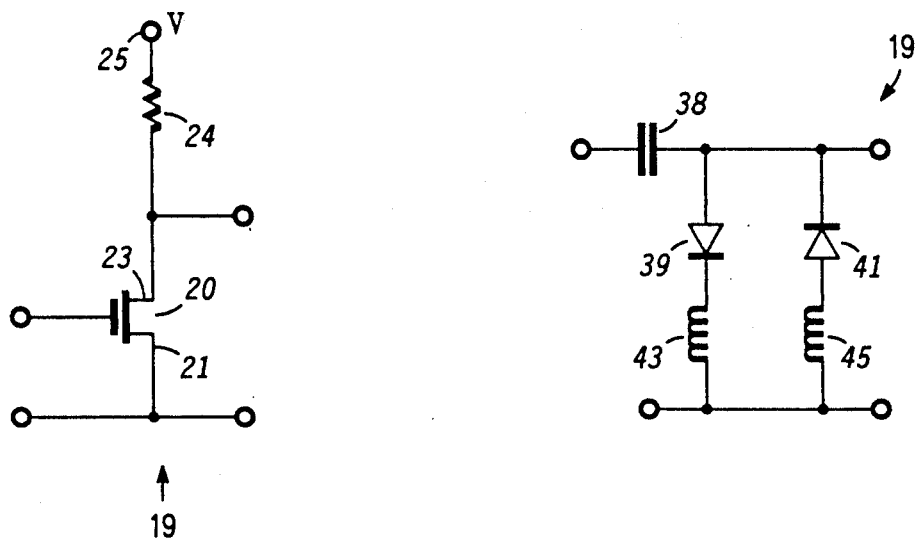
FIG. 2
FIG. 3
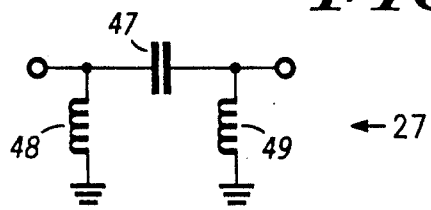
FIG. 4

OPTICAL SIGNAL FREQUENCY CONVERTER AND MIXER

BACKGROUND OF THE INVENTION

This invention relates, in general, to optical signal processing, and more particularly, to a device for optical signal frequency conversion and mixing.

Optical signal processing systems utilize modulated light signals to transmit information. Light may be modulated by applying a signal to a laser bias. This method is limited in application because laser dynamics limit how fast the laser can be modulated before problems of destructive resonance arise. Typically, a laser can be modulated up to frequencies of 4 GHz, however, higher frequencies may be obtained in special cases. Thus, applying a signal above approximately 4 GHz to a laser bias results in a noisy and unstable bias. It is desirable to modulate light at higher frequencies because more information may be transmitted at higher frequencies.

An alternative way of modulating light is by shining light on bulk materials. This method is also unacceptable because there is a significant loss of light when the material is modulated. These optical systems, typically comprise large optical systems comprising Bragg cells. Thus, it would be desirable to reduce the size, weight, and power of these optical systems. In addition, the bulk materials are incompatible with semiconductor materials and thus can not be integrated into a monolithic device.

A third way of modulating light is by transferring the optical signal to an electrical signal, then processing that electrical signal and converting it back to an optical signal. This process is very inefficient by nature due to energy lost in converting from an optical signal to an electrical signal.

By now, it should be appreciated that it would be advantageous to provide an improved system for optical signal processing.

Accordingly, it is an object of the present invention to provide an improved device for optical signal processing.

Another object of the present invention is to provide an improved device which accomplishes optical signal frequency conversion.

A further object of the present invention is to provide an optical signal processing system that can be utilized at much higher frequencies.

An additional object of the present invention is to provide a device which provides for optical signal mixing and frequency selection.

A further object of the present invention is to provide an optical processing system that is smaller than prior art optical systems.

SUMMARY OF THE INVENTION

In accordance with the present invention, the above and other objects and advantages are achieved by providing a device comprised of a photodetector, a non-linear device, passive circuitry, and a multiple quantum well structure. The photodetector acts to convert a modulated input light signal to an electrical signal. The non-linear device acts to produce harmonic signal components of the electrical signal. The passive circuitry acts to select a desired harmonic or harmonics of the electrical signal, which, in turn, modulate the multiple quantum well structure. An optical bias is supplied to the multiple quantum well structure which then acts to modulate the optical bias to produce an output light which is modulated at the chosen harmonic frequency, which is a desired multiple of the frequency of the modulated input light signal. In addition, the device can also serve as an optical signal mixer if the input light signal is modulated at more than one frequency.

BRIEF DESCRIPTION OF THE DRAWINGS

FIG 1 illustrates a block diagram of the present invention;

FIG. 2 illustrates a schematic diagram of an embodiment of a non-linear device of the present invention;

FIG. 3 illustrates a schematic diagram of another embodiment of a non-linear device of the present invention;

FIG. 4 illustrates a schematic diagram of an embodiment of frequency selective circuitry of the present invention.

DETAILED DESCRIPTION OF THE DRAWINGS

Figure 5:
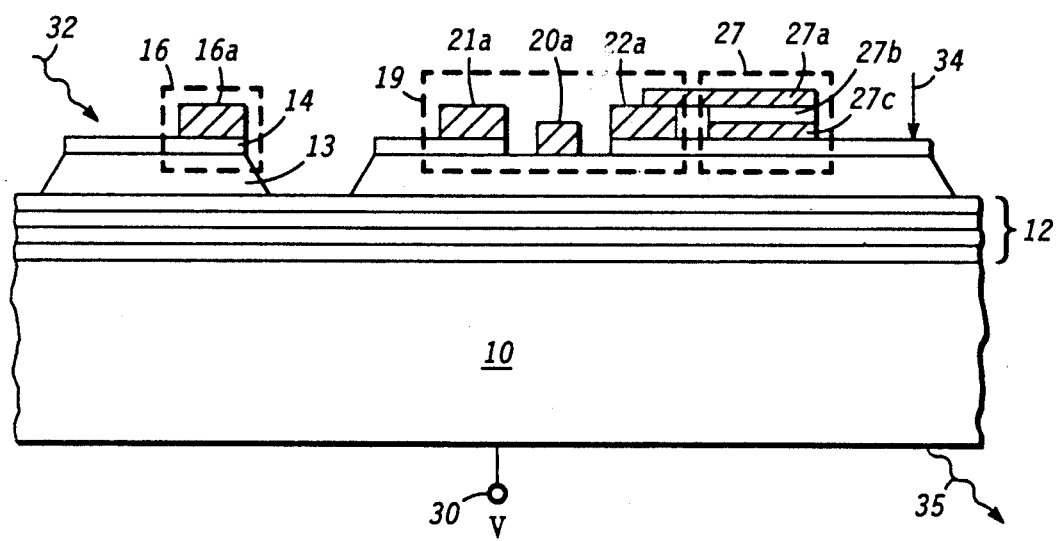
FIG. 5 illustrates an enlarged, cross-sectional view of the embodiment of the present invention.

FIG. 1 illustrates a block diagram of the present invention. A means for converting a light signal to a voltage signal or photodetector 16, converts an optical signal, an input light beam 32, which is modulated at a first frequency $f_0$, illuminated on photodetector 16 to a voltage signal, which is likewise modulated at the first frequency $f_0$. Photodetector 16 is preferably a photodiode, but other devices may be utilized. A voltage terminal 18 and a resistor 17 are coupled to photodetector 16. A means for converting the voltage signal to a current signal modulated at harmonics of the first frequency or non-linear device 19 is coupled to photodetector 16. Non-linear device 19 acts to produce a current signal having harmonic components of the voltage signal. Thus, the current signal has frequency components at frequencies $f_0$, $2xf_0$, $3xf_0$, etc. A means for selecting a second frequency from the current signal modulated at harmonics of the first frequency or frequency selective circuitry 27 is coupled to non-linear device 19. Frequency selective circuitry 27 is designed to select a desired harmonic component, the second frequency, of the current signal. Frequency selective circuitry 27 is comprised of passive circuitry such as capacitors, inductors, and resistors. A multiple quantum well 12 coupled to frequency selective circuitry 27 is modulated at the selected second frequency. A power bias 34 of unmodulated light is shown upon multiple quantum well 12. The amount of light or power bias which passes through multiple quantum well 12 is proportional to the voltage level across it. Thus, power bias 34 becomes modulated at the second frequency at which multiple quantum well 12 is modulated. The present invention thus allows for the modulation of light at much higher frequencies than was capable in the prior art. Multiple quantum well 12 is coupled to diode 31 in forward bias, which is further coupled to photodetector 16 and non-linear device 19. A voltage terminal 30 is coupled to diode 31.

Input light beam 32 that is illuminated on photodetector 16 may also be modulated at a first and a second frequency, $f_1$ and $f_2$. The device of the present invention would then act as an optical signal mixer. The voltage signal applied to non-linear device 19 in this embodiment is the sum of $f_1$ and $f_2$, a third frequency. Non-linear device 19 will therefore produce a current signal with many mixing products. Frequency selective circuitry 27 is then used to select a desired mixing product, a fourth frequency, such as $|f_1-f_2|$, to modulate multiple quantum well 12 and produce output light beam 35 modulated at this fourth frequency.

FIG. 2 illustrates a schematic diagram of an embodiment of non-linear device 19. In this embodiment, non-linear device 19 is comprised of a FET, preferably a MESFET, having a gate 20, a drain 23 and a source 21. A resistor 24 and voltage terminal 25 are coupled to drain 23. Resistor 24 and voltage terminal 25 may be discrete devices connected to drain 23. With reference to FIG. 1, gate 20 is coupled to photodetector 16, drain 23 is coupled to frequency selective circuitry 27, and source 21 is coupled to diode 31.

FIG. 3 illustrates a schematic diagram of another embodiment of non-linear device 19. Non-linear device 19 may be comprised of various Monolithic Microwave Integrated Circuit (MMIC) elements other than FETs. In this embodiment, diodes 39 and 41 are utilized in the frequency conversion process, and no external power is necessary. Inductors 43 and 45 are coupled to diodes 39 and 41 to allow only the lower harmonics of the current signal to pass to frequency selective circuitry 27. Capacitor 38, coupled to photodetector 16 and diodes 39 and 41, keeps a level of unmodulated signal from passing to diodes 39 and 41.

FIG. 4 illustrates a schematic diagram of an embodiment of frequency selective circuitry 27. Shown is a capacitor 47 coupled to inductors 48 and 49. Other passive elements and configurations may be used as desired. More sophisticated bandpass circuitry may be used to select any desired harmonic component up to approximately $10 \times f_0$. Thus, optical signal processing may be utilized at much higher frequencies than in the past. In addition, frequency selective circuitry 27 may be designed to select more than one frequency to allow multiplexing of light signals. As can be seen by FIGS. 2 through 4, non-linear device 19 and frequency selective circuitry 27 may be designed in various ways to accomplish frequency conversion, multiplication, or mixing of a modulated input light beam.

FIG. 5 illustrates an enlarged, cross-sectional view of an embodiment of the present invention. The present invention may be realized in integrated or discrete form. FIG. 5 illustrates a monolithic embodiment of the present invention. The processes used to form the various elements are standard MMIC techniques well known in the art. A III-V semiconductor substrate 10, preferably p-type semi-insulating gallium arsenide (GaAs), is provided, on which multiple quantum well 12 is fabricated. Contact to substrate 10 is made directly here, instead of through diode 31 as shown in FIG. 1. Multiple quantum well 12 is comprised of alternating layers of wide and narrow band-gap semiconductors, such as AlGaAs and GaAs. A lightly doped n-type GaAs layer 13 is formed on multiple quantum well 12, followed by a more heavily doped GaAs layer 14.

Photodetector 16, non-linear device 19, and frequency selective circuitry 27 are formed on GaAs layers 13 and 14 using standard processing techniques well known in the art. Because the fabrication of such devices is well known in the art, the processes are not described in detail here. Photodetector 16, shown as a photodiode here, is comprised of a gate metal contact 16a formed on heavily doped GaAs layer 14. Non-linear device 19, shown as a MESFET here, is fabricated by providing gate metal contact 20a on lightly doped n-type GaAs layer 13, source metal contact 21a and drain metal contact 22a on heavily doped GaAs layer 14. Frequency selective circuitry 27, shown here as being comprised of an interconnect metal layer 27a, a dielectric layer 27b, and a metal layer 27c, does not illustrate any specific device. Frequency selective circuitry 27 may be comprised of combinations of capacitors, resistors and inductors, which are comprised generally of interconnect metal layers 27a, dielectric layers 27b, metal layers 27c, and resistive layers (not shown). Interconnect metal layer 27a is shown to connect frequency selective circuitry 27 and non-linear device 19. Voltage terminal 18 and resistor 17 (both illustrated in FIG. 1) and voltage terminal 25 and resistor 24 (both illustrated in FIG. 2) are not illustrated in FIG. 5 because in this embodiment, they are not integrated on substrate 10. Because the present invention can be formed in integrated form, it is small in size, which allows for ease of use in optical signal processing. Even in discrete form, the present invention would be much smaller than the massive optical systems used in the past.

By now it should be appreciated that there has been provided an optical signal frequency converter and mixer which allows for frequency conversion, multiplication, or mixing of modulated light.

We claim:

1. A device for optical signal processing, comprising:
    a photodetector for converting alight signal modulated at a first frequency to a voltage signal modulated at the first frequency;
    a non-linear device for converting the voltage signal to a current signal modulated at harmonics of the first frequency coupled to the photodetector;
    passive circuitry for selecting a second frequency from the current signal modulated at harmonics of the first frequency coupled to the non-linear device; and
    a multiple quantum well structure coupled to the pas;sive circuitry, the multiple quantum well structure being modulated at the second frequency to provide modulation of an optical bias at the second frequency.

2. The device of claim 1 further comprising the multiple quantum well coupled to the photodetector and the non-linear device.

3. The device of claim 2 further comprising a first voltage terminal coupled to a diode which is further coupled to the multiple quantum well.

4. The device of claim 3 further comprising a voltage terminal coupled to a resistor which is further coupled to the photodetector.

5. A device for optical signal processing, comprising:
    means for converting a light signal modulated at a first frequency to a voltage signal modulated at the first frequency;
    means for converting the voltage signal to a current signal modulated at harmonics of the first frequency, the means for converting the voltage signal being coupled to the means for converting a light signal;
    means for selecting a second frequency from the current signal modulated at harmonics of the first frequency, the means for selecting a second frequency being coupled to the means for converting the voltage signal; and
    a multiple quantum well structure coupled to the means for selecting the second frequency, the multiple quantum well being modulated at the second frequency to provide modulation of an optical bias at the second frequency.

6. The device of claim 5 wherein the means for converting a light signal is comprised of a photodetector.

7. The device of claim 5 wherein the means for converting the voltage signal is comprised of a non-linear element.

8. The device of claim 7 wherein the non-linear element is comprised of a MESFET.

9. The device of claim 5 wherein the means for selecting the second frequency is comprised of passive circuitry.

10. The device of claim 9 wherein the passive circuitry is comprised of bandpass circuitry.

11. A device for optical signal processing, comprising:
   means for converting a light signal modulated at least a first and a second frequency to a voltage signal modulated at a third frequency equal to a mixing product of the first frequency and the second frequency;
   means for converting the voltage signal to a current signal modulated at mixing products of the third frequency, the means for converting the voltage signal being coupled to the means for converting a light signal;
   means for selecting a fourth frequency from the current signal modulated at mixing products of the third frequency, the means for selecting the fourth frequency being coupled to the means for converting the voltage signal; and
   a multiple quantum well structure coupled to the means for selecting the fourth frequency, the multiple quantum well being modulated at the fourth frequency to provide modulation of an optical bias at the fourth frequency.

* * * * *